United States Patent [19]

Jiang et al.

[11] Patent Number: 5,748,665
[45] Date of Patent: May 5, 1998

[54] VISIBLE VCSEL WITH HYBRID MIRRORS

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 586,391

[22] Filed: Jan. 16, 1996

[51] Int. Cl.⁶ .................................................. H01S 3/19
[52] U.S. Cl. ........................................ 372/96; 372/50
[58] Field of Search .......................... 372/96, 50, 45

[56] References Cited

U.S. PATENT DOCUMENTS

| | | | |
|---|---|---|---|
| 5,115,442 | 5/1992 | Lee et al. | 372/96 |
| 5,258,990 | 11/1993 | Olbright et al. | 372/96 |
| 5,341,390 | 8/1994 | Yamada et al. | 372/50 |
| 5,343,487 | 8/1994 | Scott et al. | 372/46 |
| 5,493,577 | 2/1996 | Choquette et al. | 372/46 |
| 5,574,738 | 11/1996 | Morgan | 372/96 |
| 5,588,016 | 12/1996 | Otoma et al. | 372/46 |

FOREIGN PATENT DOCUMENTS

| | | | |
|---|---|---|---|
| 5-63301 | 3/1993 | Japan | 372/96 |
| 6-120610 | 4/1994 | Japan | 372/50 |

*Primary Examiner*—Rodney B. Bovernick
*Assistant Examiner*—Yisun Song
*Attorney, Agent, or Firm*—Eugene A. Parsons

[57] ABSTRACT

A vertical cavity surface emitting laser for emitting visible light, including a first mirror stack having a first portion of a first epitaxially grown material system and a second portion of a second epitaxially grown material system, an active region disposed on the first mirror stack, and a second mirror stack disposed on the active region.

16 Claims, 1 Drawing Sheet

VISIBLE VCSEL WITH HYBRID MIRRORS

FIELD OF THE INVENTION

This invention relates to vertical cavity surface emitting lasers and more specifically to high efficiency vertical cavity surface emitting lasers for emitting visible light.

BACKGROUND OF THE INVENTION

Vertical cavity surface emitting lasers (VCSEL) include a first distributed Bragg reflector, also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs\GaAs or AlGaAs\AlAs material system wherein the different refractive index of each layer of a pair is achieved by altering the aluminum content in the layers. In conventional devices, the number of mirror pairs per stack may range from 20–40 to achieve a high percentages of reflectivity, depending on the difference between the refractive indices of the layers. The large number of pairs increases the percentage of reflected light.

In attempts to increase efficiency and reduce the number of pairs required, mirror stacks have been developed which employ dielectric layers. Dielectric layers can be fabricated with a larger difference in refractive index than semiconductor materials. As a result, fewer layers are required to form an effective mirror stack. The use of dielectric layers, however, is limited due to their non-conductive nature and the fabrication techniques used in formation. Since a VCSEL is driven by electrical current passed between the first and second contacts, generally through the entire device, the use of dielectric layers requires modification of the device, such as by moving the contacts, so that the current avoids the dielectric layers. This generally limits the use of dielectric layers to the top mirror stack.

In conventional VCSELs, conventional material systems perform adequately. However, new products are being developed requiring VCSELs which emit light in the visible wavelengths. To achieve high efficiency, the mirror stacks must reflect an extremely high percentage of the light, generally greater than 99%. This requires many mirror pairs in each mirror stack. When the VCSEL is operating in visible wavelengths, the use of many mirror pairs of the AlAs\GaAs material system greatly reduces optical quantum efficiency due to photon absorption by the arsenide in the material system.

Other material systems, which do not absorb visible light may be used, but this generally results in a lattice mismatch which can adversely effect the operation and lifetime of the VCSEL.

It would be highly advantageous, therefore, to remedy the foregoing and other deficiencies inherent in the prior art.

Accordingly, it is an object of the present invention to provide a new and improved VCSEL.

Another object of the invention is to provide high efficiency visible light VCSEL.

And another object of the invention is to provide a new and improved mirror stack for use in a VCSEL.

Still another object of the immediate invention is to provide an efficient mirror stack for use on a visible light VCSEL.

Yet another object of the invention is to reduce the complexity of mirror growth in a visible light VCSEL.

Another object of the present invention is to provide a mirror stack which can be lattice matched.

SUMMARY OF THE INVENTION

Briefly, to achieve the desired objects of the instant invention in accordance with a preferred embodiment thereof, provided is a VCSEL for emitting visible light. The VCSEL includes a first mirror stack including a first portion of a first epitaxially grown material system and a second portion of a second epitaxially grown material system, an active region disposed on the first mirror stack, and a second mirror stack disposed on the active region.

In a more specific embodiment, the VCSEL includes a substrate, a first mirror stack disposed on the substrate, the first mirror stack including a first portion of a first epitaxially grown material system and a second portion of a second epitaxially grown material system, an active region disposed on the first mirror stack, and a second mirror stack disposed on the active region.

A more specific embodiment includes a graded matching layer positioned intermediate the first and second portions of the first mirror stack.

In yet a more specific embodiment, the VCSEL includes an active layer sandwiched between a first cladding layer adjacent the first mirror stack and a second cladding layer adjacent the second mirror stack, the first and second cladding layers are graded to lattice couple the active layer with the first mirror stack and the second mirror stack respectively.

In a further embodiment, the VCSEL includes a third portion of the first mirror stack, the third portion is positioned intermediate the first and second portions and is formed of a third material system.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENTS

Figures 1, 3:
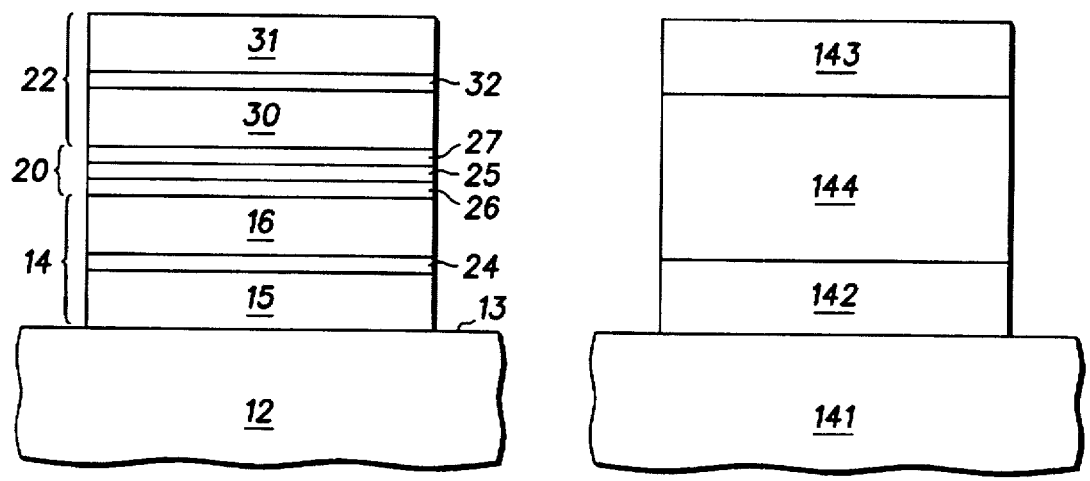
FIG. 1 is a sectional view of a first embodiment of a VCSEL in accordance with the present invention.
FIG. 3 is a partial cross section illustrating yet another embodiment of a hybrid mirror stack.

Turning now to the drawings in which like reference characters indicate corresponding elements throughout the several views, attention is first directed to FIG. 1 which illustrates a visible light vertical cavity surface emitting laser (VCSEL) generally designated 10. VCSEL 10 is formed on a substrate 12, which in this specific embodiment, is GaAs.

GaAs is preferably used to facilitate epitaxial growth of the components of VCSEL 10 which emits light in the visible wavelengths approximately in the range of 590 nm–700 nm. It should be understood that GaAs is only utilized as an example and other semiconductor materials may be employed as substrate 12.

Substrate 12 has an upper surface 13 on which a mirror stack 14 is disposed. Mirror stack 14 includes a portion 15 of a first epitaxially grown material system and a portion 16 of a second epitaxially grown material system. An active region 20 is disposed on mirror stack 14, and a second mirror stack 22 is disposed on active region 20.

Mirror stack 14 is grown by epitaxially depositing layers on substrate 12. In order to crystal lattice match mirror stack 14 to substrate 12, a suitable semiconductor material system must be deposited. In this specific example, substrate 12 is GaAs and, therefore, an AlAs/AlGaAs material system is employed for portion 15. Approximately 20–30 mirror pairs of this material system are deposited on substrate 12. Portion 16 is then deposited on portion 15 consisting of mirror pairs from a material system which is efficient at reflecting visible light. In this instance, an AlInP/AlGaInP material system is employed with approximately 5–10 mirror pairs.

Mirror stack 14 is a hybrid mirror, employing more than one material system in order to increase the percentage of reflected light with a smaller stack of mirrors, increase optical quantum efficiency by reducing photon absorption of visible light and achieve a lattice match within mirror stack 14 and VCSEL 10. Portion 16 is positioned adjacent active region 20 to reflect a large percentage of the photons emitted by active region 20. Due to the nature of the material system used, there is no appreciable absorption of photons, thereby, increasing optical efficiency. If used alone, the material system (in this example AlInP/AlGaInP) would require a large number of mirror pairs in order to achieve the high reflection percentage required. Using a large number of these mirror pairs would dramatically reduce efficiency and adversely effect the functioning of the device since these materials are difficult to grow uniformly. By employing approximately 5–10 mirror pairs, the problem with uniformity does not develop, and a major portion of the light, approximately 85%, is reflected. Since portion 16 does not absorb light, optical efficiency is high.

To increase the percentage of reflected light to the desired level, portion 15 is included in mirror stack 14 adjacent substrate 12. Due to the nature of the material system used, lattice matching is easily achieved between the layers and with substrate 12. The relatively simple procedure and the ease of lattice matching allows a large number of mirror pairs to be formed, thus increasing the percentage of reflected light to the desired level.

To ensure proper lattice matching between portion 15 and portion 16, reduce strain, and to simplify fabrication, a graded matching layer 24 is formed intermediate portion 15 and portion 16 of mirror stack 14. To continue the example used above, graded matching layer 24 is formed of a material system including AlGaInP/GaInP/GaAsP and is generally less than one mirror pair thick. Graded matching layer 24 is graded from the GaAsP material adjacent portion 15, to AlGaInP adjacent portion 16.

Active region 20 preferably includes an active layer 25 sandwiched between cladding layers 26 and 27. Active layer 25 may be a single or multiple quantum well structure, with the multiple quantum well structure including quantum well layers separated by barrier layers in a well known fashion. To produce visible light, suitable materials should be employed. In this specific embodiment, the quantum well layers are formed of GaInP and the barrier layers are formed of GaAlInP. Cladding layer 26 is graded to crystal lattice match active layer 25 with mirror stack 14. To continue this specific example, cladding layer 26 is formed of an AlInP/GaAlInP material system, with the AlInP adjacent portion 16 and GaAlInP adjacent active layer 25.

Mirror stack 22 may be formed substantially as described above for mirror stack 14, with a portion 30 and a portion 31 separated by a graded matching layer 32. Portion 30 is positioned proximate active region 20, and portion 31 is positioned away from active region 20. Portions 30 and 31 may be formed of the same material systems as described previously for mirror stack 14, and operate in a similar manner.

Those skilled in the art will readily understand that one or the other of mirror stacks 14 and 22 may be a hybrid mirror stack as presented above with the other being a conventional mirror stack, such as including a plurality of pairs of layers using the AlAs/AlGaAs material system. In this instance, it is desirable to maintain the Aluminum content below 0.6 in order to reduce absorption of photons in the visible wavelengths of operation, approximately 590 nm–700 nm.

Figure 2:
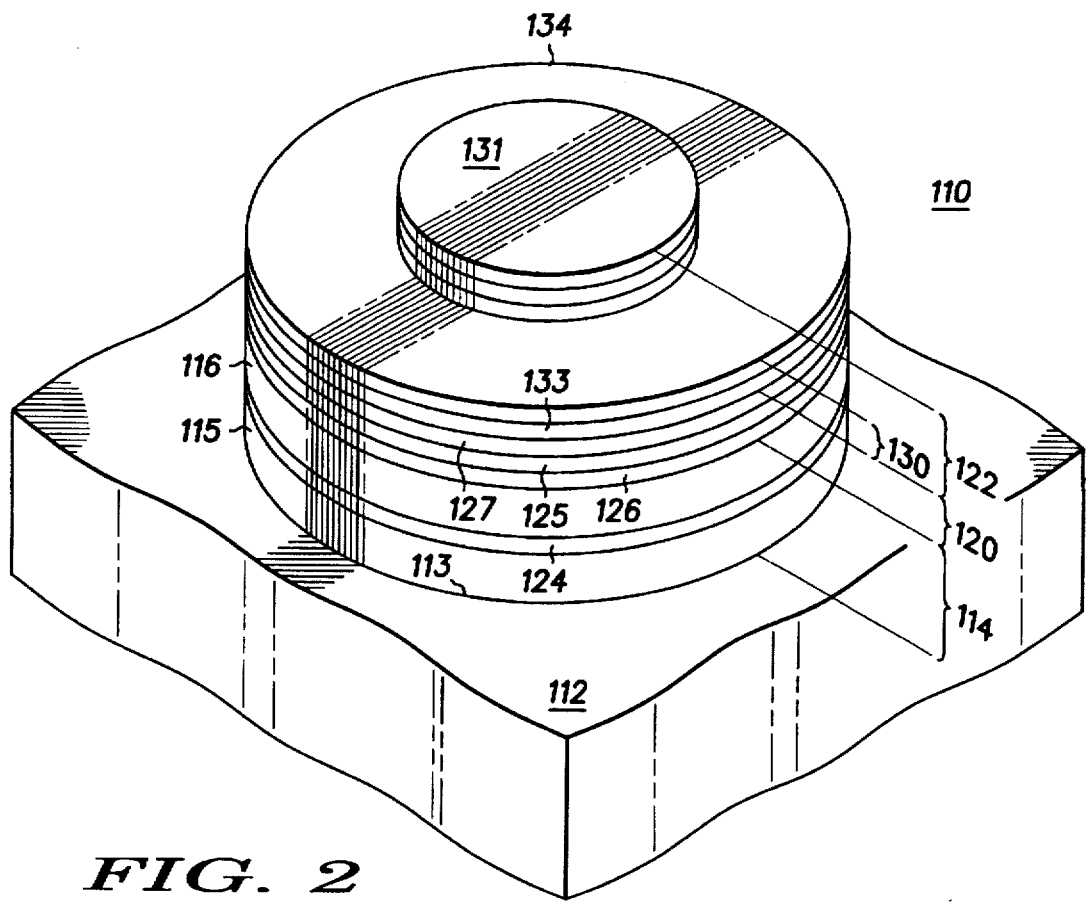
FIG. 2 is an isometric view of a further embodiment of a VCSEL in accordance with the present invention.

Turning now to FIG. 2, a further embodiment of a visible light vertical cavity surface emitting laser (VCSEL) generally designated 110 is illustrated. VCSEL 110 is illustrated to further demonstrate the possible variations of the use of hybrid mirrors in a VCSEL. VCSEL 110 is formed on a substrate 112, which, as with the previous embodiment, is GaAs. GaAs is preferably used to facilitate epitaxial growth of the components of VCSEL 110 which emits light in the visible wavelengths approximately in the range of 590 nm–700 nm. It should be understood that other semiconductor materials may be employed as substrate 112, which other materials will be understood by those skilled in the art.

Substrate 112 has an upper surface 113 on which a mirror stack 114 is disposed. Mirror stack 114 is generally identical to mirror stack 14 described previously, and includes a portion 115 of a first epitaxially grown material system and a portion 116 of a second epitaxially grown material system. An active region 120 is disposed on mirror stack 114, and a mirror stack 122 is disposed on active region 120.

Mirror stack 114 is grown by epitaxially depositing layers on substrate 112 in a fashion well known to those skilled in the art. To ensure proper crystal lattice matching of portion 115 and portion 116, a graded matching layer 124 is formed intermediate portion 115 and portion 116. Since mirror stack 114 is identical to mirror stack 14, it will not be described in detail.

Mirror stack 114 is a hybrid mirror, employing more than one material system in order to increase the percentage of reflected light with a small (or practical) number of mirror pairs, increase optical quantum efficiency by reducing photon absorption of visible light and achieve a crystal lattice match within mirror stack 114 and VCSEL 110.

Active region 120 preferably includes an active layer 125 sandwiched between cladding layers 126 and 127. Active region 120 may include a single or multiple quantum wells and is identical to active region 20 described previously, therefore it will not be described in detail.

Mirror stack 122 includes a portion 130 of a first epitaxially grown material system positioned adjacent active region 120 and a portion 131 of a second material system. In this specific embodiment, portion 130 of the first material system of mirror stack 122 includes an InAlGaP layer 133 proximate active region 120, and a GaInP electrical contact layer 134. Cladding layer 127 provides a grading as discussed previously, which lattice matches portion 130 to active layer 120. Portion 131 of the second material system includes alternating layers of a dielectric material. Stacks of dielectric mirrors are well known in the art and will not be elaborated upon herein. Since a dielectric material is employed for portion 131, portion 130 must have contact layer 134 through which a current is passed. Portion 131 is formed into a mesa structure to permit convenient access to the surface of contact layer 134.

Thus, VCSEL 110 is constructed to emit light in the visible wavelength by constructing mirror stack 114 so as to include a hybrid mirror formed of two different material systems designed to provide the optimum amount of reflection with the lowest number of mirror pairs while providing reduced light absorption and crystal matching for the most efficient operation and fabrication. Further, mirror stack 122 is formed with an easily accessible electrical contact while incorporating dielectric mirrors which are small, easily fabricated, and provide high reflectivity.

With reference to FIG. 3, a partial cross section of an embodiment of a hybrid mirror stack generally designated 140 is illustrated. One skilled in the art will understand that hybrid mirror stack 140 may be employed as a top mirror stack, a bottom mirror stack or utilized as both, but for purposes of orientation, it will be described as formed on a substrate 141. Hybrid mirror stack 140 includes a portion 142 of a first epitaxially grown material system, a portion 143 of a second epitaxially grown material system and a portion 144 positioned intermediate portion 142 and portion 143 and formed of a third material system.

In order to crystal lattice match mirror stack 140 to substrate 141, a suitable semiconductor material system is utilized. In this example, substrate 141 is GaAs. Therefore, an AlAs/Al$_x$GaAs material system is employed for portion 142. Portion 144 is epitaxially grown on portion 142, and consists of mirror pairs formed from a material system preferably consisting of alternating layers of Al$_{x1}$GaInP and Al$_{x2}$GaInP. Portion 143 is then epitaxially grown on portion 144, consisting of mirror pairs from a material system which is efficient at reflecting visible light. In this instance, an AlInP/AlGaInP material system is employed. In this embodiment, the material system of portion 142 is chosen to be crystal lattice matched to substrate 141. The material system of portion 144 is substantially crystal lattice matched to portion 142 and to portion 143 with an acceptable amount of strain so that portion 142 can provide a maximum amount of reflectivity (approximately 85%) and portions 144 and 143 can provide the remaining required reflectivity while terminating the hybrid mirror in a reasonable number of mirror pairs, with a minimum amount of light absorption and relatively easy fabrication.

Various changes and modifications to the embodiments herein chosen for purposes of illustration will readily occur to those skilled in the art. For example, it will be readily understood that a single hybrid mirror may be employed in a VCSEL or both mirrors may be hybrids. Furthermore, it should be understood that VCSEL structure symmetry exists for both the p and n dopants as well as electrically inverted structure designs. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A vertical cavity surface emitting laser for emitting visible light, the vertical cavity surface emitting laser comprising:

a first mirror stack including a first portion of a first epitaxially grown material system including alternating layers of AlAs and AlGaAs, a second portion of a second epitaxially grown material system positioned adjacent the active region and including InAlP and InAlGaP, and a third portion of the first mirror stack, the third portion being positioned intermediate the first and second portions and formed of a third material system wherein the third material system includes alternating layers of Al$_{x1}$GaInP and Al$_{x2}$GaInP, wherein x1 and x2 represent different amounts of aluminum to provide pairs of layers with different indices of refraction;

an active region disposed on the first mirror stack; and a second mirror stack disposed on the active region.

2. A vertical cavity surface emitting laser as claimed in claim 1 further including a graded matching layer positioned intermediate the first and second portions of the first mirror stack.

3. A vertical cavity surface emitting laser as claimed in claim 2 wherein the active region includes an active layer sandwiched between a first cladding layer adjacent the first mirror stack and a second cladding layer adjacent the second mirror stack.

4. A vertical cavity surface emitting laser as claimed in claim 3 wherein the first cladding layer is graded to lattice couple the active layer with the first mirror stack.

5. A vertical cavity surface emitting laser for emitting visible light, the vertical cavity surface emitting laser comprising:

a substrate;

a first mirror stack disposed on the substrate, the first mirror stack including a first portion of a first epitaxially grown material system positioned adjacent the substrate and including alternating layers of AlAs and AlGaAs, a second portion of a second epitaxially grown material system positioned adjacent the active region and including InAlP and InAlGaP, and a third portion positioned intermediate the first and second portions and formed of a third material system, the third material system including alternating layers of Al$_{x1}$GaInP and Al$_{x2}$GaInP, wherein x1 and x2 represent different amounts of aluminum to provide pairs of layers with different indices of refraction;

an active region disposed on the first mirror stack; and a second mirror stack disposed on the active region.

6. A vertical cavity surface emitting laser as claimed in claim 5 further including a graded matching layer positioned intermediate the first and second portions of the first mirror stack.

7. A vertical cavity surface emitting laser as claimed in claim 6 wherein the active region includes an active layer sandwiched between a first cladding layer adjacent the first mirror stack and a second cladding layer adjacent the second mirror stack.

8. A vertical cavity surface emitting laser as claimed in claim 7 wherein the first and second cladding layers are graded to lattice couple the active layer with the first mirror stack and the second mirror stack respectively.

9. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs and a graded matching layer positioned intermediate the layers of AlAs/AlGaAs and the layers of AlInP/AlGaInP of the first mirror stack;

an active region disposed on the first mirror stack; and a second mirror stack disposed on the active region and including first, second and third portions, the third portion being positioned intermediate the first and second portions and formed of a third material system and the third material system including alternating layers of $Al_{x1}GaInP$ and $Al_{x2}GaInP$, wherein x1 and x2 represent different amounts of aluminum to provide pairs of layers with different indices of refraction.

10. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs;

an active region disposed on the first mirror stack and including an active layer sandwiched between a first cladding layer adjacent the first mirror stack and a second cladding layer adjacent the second mirror stack; and a second mirror stack disposed on the active region and including a first portion of a first material system and a second portion of a second material system, the first material system including an InAlGaP layer proximate the active region, and a GaInP contact layer, and the second material system including alternating layers of dielectric material.

11. A vertical cavity surface emitting laser as claimed in claim 10 wherein the active layer includes GaInP quantum wells and GaAlInP barrier layers, and the first and second cladding layers are graded from AlInP adjacent the respective mirror stack to GaAlInP adjacent the active layer.

12. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs;

an active region disposed on the first mirror stack and including an active layer sandwiched between a first cladding layer adjacent the first mirror stack and a second cladding layer adjacent the second mirror stack; and a second mirror stack disposed on the active region and including first, second and third portions, the third portion positioned intermediate the first and second portions and formed of a third material system including alternating layers of $Al_{x1}GaInP$ and $Al_{x2}GaInP$, wherein x1 and x2 represent different amounts of aluminum to provide pairs of layers with different indices of refraction.

13. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs and a graded matching layer positioned intermediate the layers of AlAs/AlGaAs and the layers of AlInP/AlGaInP of the first mirror stack;

an active region disposed on the first mirror stack; and a second mirror stack disposed on the active region and including a first portion of a first epitaxially grown material system positioned adjacent the active region and a second portion of a second material system, the first material system of the second mirror stack including an InAlGaP layer proximate the active region, and a GaInP contact layer, and the second material system including alternating layers of dielectric material.

14. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs, and further including alternating layers of $Al_{x1}GaInP$ and $Al_{x2}GaInP$ positioned intermediate the layers of AlAs/AlGaAs and the layers of AlInP/AlGaInP, wherein x1 and x2 represent different amounts of aluminum to provide pairs of layers with different indices of refraction;

an active region disposed on the first mirror stack and including an active layer sandwiched between a first cladding layer adjacent the first mirror stack and a second cladding layer adjacent the second mirror stack, the first and second cladding layers being graded to lattice couple the active layer with the first mirror stack and the second mirror stack respectively; and a second mirror stack disposed on the active region.

15. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs;

an active region disposed on the first mirror stack; and a second mirror stack disposed on the active region and including a first portion of a first epitaxially grown material system positioned adjacent the active region and including alternating layers of InAlP and InAlGaP, a second portion of a second material system including alternating layers of AlAs and AlGaAs, and a third portion positioned intermediate the first and second portions and formed of a third material system including alternating layers of $Al_{x1}GaInP$ and $Al_{x2}GaInP$, wherein x1 and x2 represent different amounts of aluminum to provide pairs of layers with different indices of refraction.

16. A vertical cavity surface emitting laser for emitting visible light, the vertical cavity surface emitting laser comprising:

a GaAs substrate a first mirror stack including a plurality of alternating layers of AlAs and AlGaAs disposed on the substrate and alternating layers of AlInP and AlGaInP disposed on the layers of AlAs and AlGaAs;

an active region disposed on the first mirror stack; and a second mirror stack disposed on the active region and including a first portion of a first epitaxially grown material system positioned adjacent the active region and including an InAlGaP layer proximate the active region and a GaInP contact layer, and a second portion of a second material system including alternating layers of dielectric material.

* * * * *